United States Patent
Alexander

(10) Patent No.: US 8,809,096 B1
(45) Date of Patent: Aug. 19, 2014

(54) BELL JAR EXTRACTION TOOL METHOD AND APPARATUS FOR THIN FILM PHOTOVOLTAIC MATERIALS

(75) Inventor: Paul Alexander, San Jose, CA (US)

(73) Assignee: Stion Corporation, San Jose, CA (US)

( * ) Notice: Subject to any disclaimer, the term of this patent is extended or adjusted under 35 U.S.C. 154(b) by 972 days.

(21) Appl. No.: 12/909,563

(22) Filed: Oct. 21, 2010

Related U.S. Application Data

(60) Provisional application No. 61/254,194, filed on Oct. 22, 2009.

(51) Int. Cl.
*H01L 21/00* (2006.01)

(52) U.S. Cl.
USPC .................................. 438/57; 118/64; 427/74

(58) Field of Classification Search
USPC .................................. 438/57; 118/64; 427/74
See application file for complete search history.

(56) References Cited

U.S. PATENT DOCUMENTS

| | | |
|---|---|---|
| 3,520,732 A | 7/1970 | Nakayama et al. |
| 3,828,722 A | 8/1974 | Reuter et al. |
| 3,975,211 A | 8/1976 | Shirland |
| 4,062,038 A | 12/1977 | Cuomo et al. |
| 4,263,336 A | 4/1981 | Thompson et al. |
| 4,332,974 A | 6/1982 | Fraas |
| 4,335,266 A | 6/1982 | Mickelsen et al. |
| 4,441,113 A | 4/1984 | Madan |
| 4,442,310 A | 4/1984 | Carlson et al. |
| 4,461,922 A | 7/1984 | Gay et al. |
| 4,465,575 A | 8/1984 | Love et al. |
| 4,471,155 A | 9/1984 | Mohr et al. |
| 4,499,658 A | 2/1985 | Lewis |
| 4,507,181 A | 3/1985 | Nath et al. |
| 4,517,403 A | 5/1985 | Morel et al. |
| 4,518,855 A | 5/1985 | Malak |
| 4,542,255 A | 9/1985 | Tanner et al. |
| 4,581,108 A | 4/1986 | Kapur et al. |
| 4,589,194 A | 5/1986 | Roy |
| 4,598,306 A | 7/1986 | Nath et al. |
| 4,599,154 A | 7/1986 | Bender et al. |
| 4,611,091 A | 9/1986 | Choudary et al. |
| 4,623,601 A | 11/1986 | Lewis et al. |

(Continued)

FOREIGN PATENT DOCUMENTS

| | | |
|---|---|---|
| AU | 1998/78651 | 2/1999 |
| AU | 2001/40599 A1 | 8/2001 |

(Continued)

OTHER PUBLICATIONS

Baumann, A., et al., Photovoltaic Technology Review, presentation Dec. 6, 2004, 18 pages.

(Continued)

*Primary Examiner* — Evan Pert
(74) *Attorney, Agent, or Firm* — Kilpatrick Townsend & Stockton, LLP

(57) ABSTRACT

An apparatus for extracting a bell jar chamber from a processing station of a thin film photovoltaic material is provided. The apparatus includes a rack fixture coupled to a robot loader. The rack fixture is configured to support the bell jar chamber to be moved using the robot loader in a horizontal direction and in a vertical direction. The apparatus further includes at least two support members configured within a vicinity of an upper region of the rack fixture.

22 Claims, 6 Drawing Sheets

(56) References Cited

U.S. PATENT DOCUMENTS

| | | |
|---|---|---|
| 4,625,070 A | 11/1986 | Berman et al. |
| 4,638,111 A | 1/1987 | Gay |
| 4,661,370 A | 4/1987 | Tarrant |
| 4,663,495 A | 5/1987 | Berman et al. |
| 4,705,912 A | 11/1987 | Nakashima et al. |
| 4,724,011 A | 2/1988 | Turner et al. |
| 4,727,047 A | 2/1988 | Bozler et al. |
| 4,751,149 A | 6/1988 | Vijayakumar et al. |
| 4,775,425 A | 10/1988 | Guha et al. |
| 4,793,283 A | 12/1988 | Sarkozy |
| 4,798,660 A | 1/1989 | Ermer et al. |
| 4,816,082 A | 3/1989 | Guha et al. |
| 4,816,420 A | 3/1989 | Bozler et al. |
| 4,865,999 A | 9/1989 | Xi et al. |
| 4,873,118 A | 10/1989 | Elias et al. |
| 4,915,745 A | 4/1990 | Pollock et al. |
| 4,950,615 A | 8/1990 | Basol et al. |
| 4,968,354 A | 11/1990 | Nishiura et al. |
| 4,996,108 A | 2/1991 | Divigalpitiya et al. |
| 5,008,062 A | 4/1991 | Anderson et al. |
| 5,011,565 A | 4/1991 | Dube et al. |
| 5,028,274 A | 7/1991 | Basol et al. |
| 5,039,353 A | 8/1991 | Schmitt |
| 5,045,409 A | 9/1991 | Eberspacher et al. |
| 5,069,727 A | 12/1991 | Kouzuma et al. |
| 5,078,803 A | 1/1992 | Pier et al. |
| 5,125,984 A | 6/1992 | Kruehler et al. |
| 5,133,809 A | 7/1992 | Sichanugrist et al. |
| 5,137,835 A | 8/1992 | Karg |
| 5,154,777 A | 10/1992 | Blackmom et al. |
| 5,180,686 A | 1/1993 | Banerjee et al. |
| 5,211,824 A | 5/1993 | Knapp |
| 5,217,564 A | 6/1993 | Bozler et al. |
| 5,231,047 A | 7/1993 | Ovshinsky et al. |
| 5,248,345 A | 9/1993 | Sichanugrist et al. |
| 5,259,883 A | 11/1993 | Yamabe et al. |
| 5,261,968 A | 11/1993 | Jordan |
| 5,298,086 A | 3/1994 | Guha et al. |
| 5,336,381 A | 8/1994 | Dalzell, Jr. et al. |
| 5,336,623 A | 8/1994 | Sichanugrist et al. |
| 5,346,853 A | 9/1994 | Guha et al. |
| 5,397,401 A | 3/1995 | Toma et al. |
| 5,399,504 A | 3/1995 | Ohsawa |
| 5,436,204 A | 7/1995 | Albin et al. |
| 5,445,847 A | 8/1995 | Wada |
| 5,474,939 A | 12/1995 | Pollock et al. |
| 5,501,744 A | 3/1996 | Albright et al. |
| 5,512,107 A | 4/1996 | van den Berg |
| 5,518,549 A * | 5/1996 | Hellwig ................ 118/728 |
| 5,528,397 A | 6/1996 | Zavracky et al. |
| 5,536,333 A | 7/1996 | Foote et al. |
| 5,578,103 A | 11/1996 | Araujo et al. |
| 5,578,503 A | 11/1996 | Karg et al. |
| 5,622,634 A | 4/1997 | Noma et al. |
| 5,626,688 A | 5/1997 | Probst et al. |
| 5,665,175 A | 9/1997 | Safir |
| 5,676,766 A | 10/1997 | Probst et al. |
| 5,698,496 A | 12/1997 | Fastnacht et al. |
| 5,726,065 A | 3/1998 | Szlufcik et al. |
| 5,738,731 A | 4/1998 | Shindo et al. |
| 5,858,819 A | 1/1999 | Miyasaka |
| 5,868,869 A | 2/1999 | Albright et al. |
| 5,925,228 A | 7/1999 | Panitz et al. |
| 5,977,476 A | 11/1999 | Guha et al. |
| 5,981,868 A | 11/1999 | Kushiya et al. |
| 5,985,691 A | 11/1999 | Basol et al. |
| 6,040,521 A | 3/2000 | Kushiya et al. |
| 6,048,442 A | 4/2000 | Kushiya et al. |
| 6,092,669 A | 7/2000 | Kushiya et al. |
| 6,107,562 A | 8/2000 | Hashimoto et al. |
| 6,127,202 A | 10/2000 | Kapur et al. |
| 6,160,215 A | 12/2000 | Curtin |
| 6,166,319 A | 12/2000 | Matsuyama |
| 6,172,297 B1 | 1/2001 | Hezel et al. |
| 6,258,620 B1 | 7/2001 | Morel et al. |
| 6,284,312 B1 * | 9/2001 | Chandra et al. ............... 427/237 |
| 6,288,325 B1 | 9/2001 | Jansen et al. |
| 6,294,274 B1 | 9/2001 | Kawazoe et al. |
| 6,307,148 B1 | 10/2001 | Takeuchi et al. |
| 6,310,281 B1 | 10/2001 | Wendt et al. |
| 6,323,417 B1 | 11/2001 | Gillespie et al. |
| 6,328,871 B1 | 12/2001 | Ding et al. |
| RE37,512 E | 1/2002 | Szlufcik et al. |
| 6,361,718 B1 | 3/2002 | Shinmo et al. |
| 6,365,225 B1 * | 4/2002 | Chandra et al. ............... 427/237 |
| 6,372,538 B1 | 4/2002 | Wendt et al. |
| 6,423,565 B1 | 7/2002 | Barth et al. |
| 6,632,113 B1 | 10/2003 | Noma et al. |
| 6,635,307 B2 | 10/2003 | Huang et al. |
| 6,653,701 B1 | 11/2003 | Yamazaki et al. |
| 6,667,492 B1 | 12/2003 | Kendall |
| 6,690,041 B2 | 2/2004 | Armstrong et al. |
| 6,692,820 B2 | 2/2004 | Forrest et al. |
| 6,784,492 B1 | 8/2004 | Morishita |
| 6,852,920 B2 | 2/2005 | Sager et al. |
| 6,878,871 B2 | 4/2005 | Scher et al. |
| 6,974,976 B2 | 12/2005 | Hollars |
| 7,122,398 B1 | 10/2006 | Pichler |
| 7,179,677 B2 | 2/2007 | Ramanathan et al. |
| 7,194,197 B1 | 3/2007 | Wendt et al. |
| 7,220,321 B2 | 5/2007 | Barth et al. |
| 7,235,736 B1 | 6/2007 | Buller et al. |
| 7,252,923 B2 | 8/2007 | Kobayashi |
| 7,265,037 B2 | 9/2007 | Yang et al. |
| 7,319,190 B2 | 1/2008 | Tuttle |
| 7,364,808 B2 | 4/2008 | Sato et al. |
| 7,441,413 B2 | 10/2008 | Bae et al. |
| 7,442,413 B2 | 10/2008 | Zwaap et al. |
| 7,544,884 B2 | 6/2009 | Hollars |
| 7,736,755 B2 | 6/2010 | Igarashi et al. |
| 7,741,560 B2 | 6/2010 | Yonezawa |
| 7,855,089 B2 | 12/2010 | Farris, III et al. |
| 7,863,074 B2 | 1/2011 | Wieting |
| 7,910,399 B1 | 3/2011 | Wieting |
| 7,955,891 B2 | 6/2011 | Wieting |
| 7,960,204 B2 | 6/2011 | Lee |
| 7,993,954 B2 | 8/2011 | Wieting |
| 7,993,955 B2 | 8/2011 | Wieting |
| 7,998,762 B1 | 8/2011 | Lee et al. |
| 8,003,430 B1 | 8/2011 | Lee |
| 8,008,110 B1 | 8/2011 | Lee |
| 8,008,111 B1 | 8/2011 | Lee |
| 8,008,112 B1 | 8/2011 | Lee |
| 8,017,860 B2 | 9/2011 | Lee |
| 8,026,122 B1 | 9/2011 | Lee |
| 8,142,521 B2 | 3/2012 | Wieting |
| 8,168,463 B2 | 5/2012 | Wieting |
| 8,178,370 B2 | 5/2012 | Lee et al. |
| 8,183,066 B2 | 5/2012 | Lee et al. |
| 8,217,261 B2 | 7/2012 | Wieting |
| 8,263,494 B2 | 9/2012 | Patterson |
| 8,287,942 B1 | 10/2012 | Huang et al. |
| 2002/0002992 A1 | 1/2002 | Kariya et al. |
| 2002/0004302 A1 | 1/2002 | Fukumoto et al. |
| 2002/0061361 A1 | 5/2002 | Nakahara et al. |
| 2002/0063065 A1 | 5/2002 | Sonoda et al. |
| 2003/0075717 A1 | 4/2003 | Kondo et al. |
| 2003/0089899 A1 | 5/2003 | Lieber et al. |
| 2003/0188777 A1 | 10/2003 | Gaudiana et al. |
| 2003/0230338 A1 | 12/2003 | Menezes |
| 2004/0063320 A1 | 4/2004 | Hollars |
| 2004/0084080 A1 | 5/2004 | Sager et al. |
| 2004/0095658 A1 | 5/2004 | Buretea et al. |
| 2004/0110393 A1 | 6/2004 | Munzer et al. |
| 2004/0161539 A1 | 8/2004 | Miyakawa |
| 2004/0187917 A1 | 9/2004 | Pichler |
| 2004/0245912 A1 | 12/2004 | Thurk et al. |
| 2004/0252488 A1 | 12/2004 | Thurk |
| 2004/0256001 A1 | 12/2004 | Mitra et al. |
| 2005/0074915 A1 | 4/2005 | Tuttle et al. |
| 2005/0098205 A1 | 5/2005 | Roscheisen et al. |
| 2005/0109392 A1 | 5/2005 | Hollars |
| 2005/0164432 A1 | 7/2005 | Lieber et al. |
| 2005/0194036 A1 | 9/2005 | Basol |

(56) References Cited

U.S. PATENT DOCUMENTS

| | | |
|---|---|---|
| 2005/0287717 A1 | 12/2005 | Heald et al. |
| 2006/0034065 A1 | 2/2006 | Thurk |
| 2006/0040103 A1 | 2/2006 | Whiteford et al. |
| 2006/0051505 A1 | 3/2006 | Kortshagen et al. |
| 2006/0096536 A1 | 5/2006 | Tuttle |
| 2006/0096537 A1 | 5/2006 | Tuttle |
| 2006/0096635 A1 | 5/2006 | Tuttle |
| 2006/0102230 A1 | 5/2006 | Tuttle |
| 2006/0112983 A1 | 6/2006 | Parce et al. |
| 2006/0130890 A1 | 6/2006 | Hantschel et al. |
| 2006/0160261 A1 | 7/2006 | Sheats et al. |
| 2006/0173113 A1 | 8/2006 | Yabuta et al. |
| 2006/0174932 A1 | 8/2006 | Usui et al. |
| 2006/0219288 A1 | 10/2006 | Tuttle |
| 2006/0219547 A1 | 10/2006 | Tuttle |
| 2006/0220059 A1 | 10/2006 | Satoh et al. |
| 2006/0249202 A1 | 11/2006 | Yoo et al. |
| 2006/0267054 A1 | 11/2006 | Martin et al. |
| 2007/0006914 A1 | 1/2007 | Lee |
| 2007/0089782 A1 | 4/2007 | Scheuten et al. |
| 2007/0116892 A1 | 5/2007 | Zwaap |
| 2007/0116893 A1 | 5/2007 | Zwaap |
| 2007/0151596 A1 | 7/2007 | Nasuno et al. |
| 2007/0163643 A1 | 7/2007 | Van Duren et al. |
| 2007/0169810 A1 | 7/2007 | Van Duren et al. |
| 2007/0193623 A1 | 8/2007 | Krasnov |
| 2007/0209700 A1 | 9/2007 | Yonezawa et al. |
| 2007/0264488 A1 | 11/2007 | Lee |
| 2007/0283998 A1 | 12/2007 | Kuriyagawa et al. |
| 2007/0289624 A1 | 12/2007 | Kuriyagawa et al. |
| 2008/0029154 A1 | 2/2008 | Mishtein et al. |
| 2008/0032044 A1 | 2/2008 | Kuriyagawa et al. |
| 2008/0041446 A1 | 2/2008 | Wu et al. |
| 2008/0057616 A1 | 3/2008 | Robinson et al. |
| 2008/0092945 A1 | 4/2008 | Munteanu et al. |
| 2008/0092953 A1 | 4/2008 | Lee |
| 2008/0092954 A1 | 4/2008 | Choi |
| 2008/0105294 A1 | 5/2008 | Kushiya et al. |
| 2008/0110491 A1 | 5/2008 | Buller et al. |
| 2008/0110495 A1 | 5/2008 | Onodera et al. |
| 2008/0121264 A1 | 5/2008 | Chen et al. |
| 2008/0121277 A1 | 5/2008 | Robinson et al. |
| 2008/0204696 A1 | 8/2008 | Kamijima |
| 2008/0210303 A1 | 9/2008 | Lu et al. |
| 2008/0280030 A1 | 11/2008 | Van Duren et al. |
| 2008/0283389 A1 | 11/2008 | Aoki |
| 2009/0021157 A1 | 1/2009 | Kim et al. |
| 2009/0058295 A1 | 3/2009 | Auday et al. |
| 2009/0087940 A1 | 4/2009 | Kushiya |
| 2009/0087942 A1 | 4/2009 | Meyers |
| 2009/0145746 A1 | 6/2009 | Hollars |
| 2009/0217969 A1 | 9/2009 | Matsushima et al. |
| 2009/0234987 A1 | 9/2009 | Lee et al. |
| 2009/0235983 A1 | 9/2009 | Girt et al. |
| 2009/0235987 A1 | 9/2009 | Akhtar et al. |
| 2009/0293945 A1 | 12/2009 | Peter |
| 2010/0081230 A1 | 4/2010 | Lee |
| 2010/0087016 A1 | 4/2010 | Britt et al. |
| 2010/0087026 A1 | 4/2010 | Winkeler et al. |
| 2010/0096007 A1 | 4/2010 | Mattmann et al. |
| 2010/0101648 A1 | 4/2010 | Morooka et al. |
| 2010/0101649 A1 | 4/2010 | Huignard et al. |
| 2010/0122726 A1 | 5/2010 | Lee |
| 2010/0197051 A1 | 8/2010 | Schlezinger et al. |
| 2010/0210064 A1 | 8/2010 | Hakuma et al. |
| 2010/0233386 A1 | 9/2010 | Krause et al. |
| 2010/0258179 A1 | 10/2010 | Wieting |
| 2010/0267190 A1 | 10/2010 | Hakuma et al. |
| 2011/0018103 A1 | 1/2011 | Wieting |
| 2011/0020980 A1 | 1/2011 | Wieting |
| 2011/0070682 A1 | 3/2011 | Wieting |
| 2011/0070683 A1 | 3/2011 | Wieting |
| 2011/0070684 A1 | 3/2011 | Wieting |
| 2011/0070685 A1 | 3/2011 | Wieting |
| 2011/0070686 A1 | 3/2011 | Wieting |
| 2011/0070687 A1 | 3/2011 | Wieting |
| 2011/0070688 A1 | 3/2011 | Wieting |
| 2011/0070689 A1 | 3/2011 | Wieting |
| 2011/0070690 A1 | 3/2011 | Wieting |
| 2011/0071659 A1 | 3/2011 | Farris, III et al. |
| 2011/0073181 A1 | 3/2011 | Wieting |
| 2011/0203634 A1 | 8/2011 | Wieting |
| 2011/0212565 A1 | 9/2011 | Wieting |
| 2011/0259395 A1 | 10/2011 | Wieting et al. |
| 2011/0259413 A1 | 10/2011 | Wieting et al. |
| 2011/0269260 A1 | 11/2011 | Buquing |
| 2011/0277836 A1 | 11/2011 | Lee |
| 2012/0003789 A1 | 1/2012 | Doering et al. |
| 2012/0018828 A1 | 1/2012 | Shao |
| 2012/0021552 A1 | 1/2012 | Alexander et al. |
| 2012/0094432 A1 | 4/2012 | Wieting |
| 2012/0122304 A1 | 5/2012 | Wieting |
| 2012/0186975 A1 | 7/2012 | Lee et al. |
| 2012/0240989 A1 | 9/2012 | Ramanathan et al. |
| 2012/0270341 A1 | 10/2012 | Lee et al. |

FOREIGN PATENT DOCUMENTS

| | | |
|---|---|---|
| DE | 3314197 A1 | 11/1983 |
| DE | 10104726 A1 | 8/2002 |
| DE | 102005062977 B3 | 9/2007 |
| FR | 2646560 | 11/1990 |
| GB | 2124826 A | 2/1984 |
| JP | 2000/173969 | 6/2000 |
| JP | 2000/219512 | 8/2000 |
| JP | 2002/167695 | 6/2002 |
| JP | 2002/270871 | 9/2002 |
| JP | 2002/299670 | 10/2002 |
| JP | 2004/332043 | 11/2004 |
| JP | 2005/311292 | 11/2005 |
| WO | 01/57932 A1 | 8/2001 |
| WO | 2005/011002 | 2/2005 |
| WO | 2006/126598 A1 | 11/2006 |
| WO | 2007/022221 A2 | 2/2007 |
| WO | 2007/077171 A2 | 7/2007 |
| WO | 2008025326 A2 | 3/2008 |

OTHER PUBLICATIONS

Chopra et al., "Thin-Film Solar Cells: An Overview", 2004, Progress in Photovoltaics: Research and Applications, 2004, vol. 12, pp. 69-92.

Ellmer et al., Copper Indium Disulfide Solar Cell Absorbers Prepared in a One-Step Process by Reactive Magnetron Sputtering from Copper and Indium Targets; Elsevier Science B.V; Thin Solid Films 413 (2002) pp. 92-97.

Guillen C., "$CuInS_2$ Thin Films Grown Sequentially from Binary Sulfides as Compared to Layers Evaporated Directly from the Elements", Semiconductor Science and Technology, vol. 21, No. 5, May 2006, pp. 709-712.

Huang et al., Photoluminescence and Electroluminescence of ZnS:Cu Nanocrystals in Polymeric Networks, Applied Physics, Lett. 70 (18), May 5, 1997, pp. 2335-2337.

Huang et al., Preparation of $Zn_xCd_{1-x}S$ Nanocomposites in Polymer Matrices and their Photophysical Properties, Langmuir 1998, 14, pp. 4342-4344.

International Solar Electric Technology, Inc. (ISET) "Thin Film CIGS", Retrieved from http://www.isetinc.com/cigs.html on Oct. 1, 2008, 4 pages.

Kapur et al., "Fabrication of CIGS Solar Cells via Printing of Nanoparticle Precursor Inks", DOE Solar Program Review Meeting 2004, DOE/GO-102005-2067, p. 135-136.

Kapur et al., "Non-Vacuum Printing Process for CIGS Solar Cells on Rigid and Flexible Substrates", 29th IEEE Photovoltaic Specialists Conf., New Orleans, LA, IEEE, 2002, pp. 688-691.

Kapur et al., "Non-Vacuum Processing of CIGS Solar Cells on Flexible Polymer Substrates", Proceedings of the Third World Conference on Photovoltaic Energy Conversion, Osaka, Japan, 2P-D3-43, 2003.

Kapur et al., "Non-Vacuum Processing of $CuIn_{1-x}Ga_xSe_2$ Solar Cells on Rigid and Flexible Substrates using Nanoparticle Precursor Inks", Thin Solid Films, 2003, vol. 431-432, pp. 53-57.

(56) References Cited

OTHER PUBLICATIONS

Kapur et al., "Fabrication of Light Weight Flexible CIGS Solar Cells for Space Power Applications", Materials Research Society, Proceedings vol. 668, (2001) pp. H3.5.1-H3.5.6.

Kapur et al., "Nanoparticle Oxides Precursor Inks for Thin Film Copper Indium Gallium Selenide (CIGS) Solar Cells", Materials Research Society Proceedings, vol. 668, (2001) pp. H2.6.1-H2.6.7.

Mehta et al., "A graded diameter and oriented nanorod-thin film structure for solar cell application: a device proposal", Solar Energy Materials & Solar Cells, 2005, vol. 85, pp. 107-113.

Onuma et al., Preparation and Characterization of $CuInS_2$ Thin Films Solar Cells with Large Grain, Elsevier Science B.V; Solar Energy Materials & Solar Cells 69 (2001) pp. 261-269.

Salvador, "Hole diffusion length in $n$-$TiO_2$ single crystals and sintered electrodes: photoelectrochemical determination and comparative analysis," Journal of Applied Physics, vol. 55, No. 8, pp. 2977-2985, Apr. 15, 1984.

Srikant V., et al., "On the Optical Band Gap of Zinc Oxide", Journal of Applied Physics, vol. 83, No. 10, May 15, 1998, pp. 5447-5451.

Yang et al., "Preparation, Characterization and Electroluminescence of ZnS Nanocrystals in a Polymer Matrix", Journal Material Chem., 1997, vol. 7, No. 1, pp. 131-133.

Yang et al., "Electroluminescence from ZnS/CdS Nanocrystals/Polymer Composite", Synthetic Metals 1997, vol. 91, pp. 347-349.

Yang et al., "Fabrication and Characteristics of ZnS Nanocrystals/Polymer Composite Doped with Tetraphenylbenzidine Single Layer Structure Light-emitting Diode", Applied Physics Letters, vol. 69, No. 3, Jul. 15, 1996, pp. 377-379.

\* cited by examiner

BELL JAR EXTRACTION TOOL METHOD AND APPARATUS FOR THIN FILM PHOTOVOLTAIC MATERIALS

CROSS-REFERENCE TO RELATED APPLICATION

This application claims priority to U.S. Provisional Patent Application No. 61/254,194, filed Oct. 22, 2009, entitled "BELL JAR EXTRACTION TOOL METHOD AND APPARATUS" by inventor Paul Alexander, commonly assigned and incorporated by reference herein for all purposes.

BACKGROUND OF THE INVENTION

The present invention relates generally to the manufacture of thin-film photovoltaic modules. More particularly, the present invention provides a method and tool for extracting a supersized chamber used for the manufacture of thin film photovoltaic modules. Merely by way of example, the present invention provides a tool for lifting and extracting a supersized bell jar chamber against gravity load without causing stress-related failure.

Solar energy technology generally converts electromagnetic radiation from the sun to other useful forms of energy. These other forms of energy include thermal energy and electrical power. For electrical power applications, solar cells are often used. Although solar energy is environmentally clean and has been successful to a point, many limitations remain to be resolved before it becomes widely used throughout the world. As an example, one type of solar cell uses crystalline materials, which are derived from semiconductor material ingots. These crystalline materials can be used to fabricate optoelectronic devices that include photovoltaic and photodiode devices that convert electromagnetic radiation into electrical power. However, crystalline materials are often costly and difficult to make on a large scale. Additionally, devices made from such crystalline materials often have low energy conversion efficiencies. Other types of solar cells use "thin film" technology to form a thin film of photosensitive material to be used to convert electromagnetic radiation into electrical power. One advantage of the use of thin film technology in making solar cells is to form modules direct on large sized glass substrates. That requires, at the same time, supersized processing system for treating the thin film cells associated with the large sized glass substrates. Additionally, the processing system is subjected to routing maintenance for maintain thin-film process reliability for enhancing solar cell efficiency depending on applications. Often, conventional tools for handing the supersized processing system are either not available or unfit for newly developed system.

From the above, it is seen that improved apparatus and method for handling new supersized processing system for the manufacture of thin-film solar modules are desired.

BRIEF SUMMARY OF THE INVENTION

The present invention relates generally to the manufacture of thin-film photovoltaic modules. More particularly, the present invention provides a method and tool for handling a supersized processing chamber used for the manufacture of thin film photovoltaic modules. Merely by way of example, the present invention provides a tool for lifting and extracting a supersized bell jar chamber against gravity load without causing stress-related failure.

In a specific embodiment, the present invention provides an apparatus for extracting a bell jar chamber from a processing station of a thin film photovoltaic material. The apparatus includes a rack fixture coupled to a robot loader. The rack fixture is configured to support the bell jar chamber to be moved using the robot loader in a horizontal direction and in a vertical direction. The horizontal direction is normal to the vertical direction. The apparatus further includes at least two support members configured within a vicinity of an upper region of the rack fixture. The two support members have respective arc length regions. The respective arc length regions support at least respective upper inner regions of the bell jar chamber. The rack fixture is in a lifting configuration having the at least two support members to form an intimate contact via a soften material with the upper inner region of the bell jar chamber against all external load. The lifting configuration is associated with a stress indicator of the bell jar chamber to be greater than an intrinsic factor of safety.

In an alternative embodiment, the present invention provides a method for extracting a bell jar chamber with a brittle mechanical characteristic. The method includes providing a rack fixture having at least two support members. Each support member includes an upper edge region. The method further includes inserting the rack fixture including the at least two support members from an open end horizontally into a bell jar chamber along an axial direction of the bell jar chamber. Furthermore, the method includes moving the rack fixture to use the at least two support members to lift the bell jar chamber against a gravitational force for extracting the bell jar chamber from a processing station.

In yet another alternative embodiment, the present invention provides a method for handling a chamber for manufacturing a photovoltaic device. The method includes providing a rack fixture having at least two support members. The method further includes inserting the rack fixture including the at least two support members from an open end into the chamber along an axial direction. Additionally, the method includes raising the rack fixture to form a contact region between each of the two support members and an upper inner region of the chamber. The method further includes lifting the chamber against gravity load and disposing the chamber to a processing station. The processing station includes at least one or more heaters. Furthermore, the method included transferring a substrate bearing a thin-film precursor material into the chamber and sealing the open end of the chamber to create a vacuum condition. The method further includes filling a work gas in the chamber to maintain a predetermined gaseous environment. Moreover, the method includes performing a reactive thermal treatment to the thin-film precursor material in the gaseous environment by supplying thermal energy from the one or more heaters based on a predetermined temperature profile. Through the reactive thermal treatment the thin-film precursor material is transformed to a photovoltaic absorber.

The invention provides the benefit of safely handling a supersized bell jar process chamber of brittle material. The process chamber then can be removed from a manufacturing system for maintenance and replaced by a redundant chamber for substantial saving in process time.

DETAILED DESCRIPTION OF THE INVENTION

The present invention relates generally to the manufacture of thin-film photovoltaic modules. More particularly, the present invention provides a method and tool for handling a supersized processing chamber used for the manufacture of thin film photovoltaic modules. The invention provides a tool for lifting and extracting a supersized bell jar chamber against gravity load without causing stress-related failure.

Figure 1:
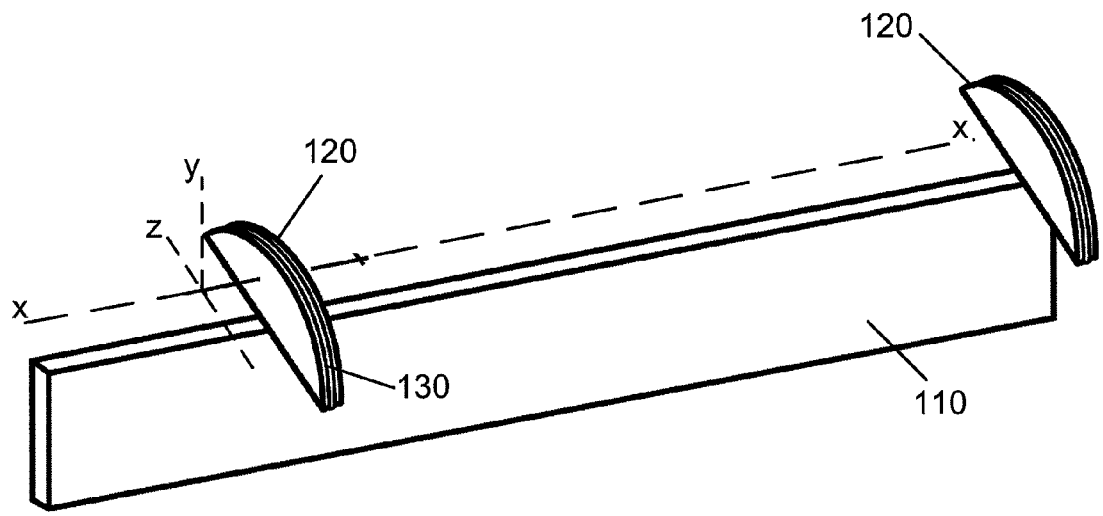
FIG. 1 is a schematic perspective view of a tool for extracting a bell jar chamber according to an embodiment of the present invention.

FIG. 1 is a schematic perspective view of a tool for extracting a bell jar chamber according to an embodiment of the present invention. This diagram is merely an example, which should not unduly limit the claims herein. One of ordinary skilled should recognize many variations, alternatives, and modifications in geometric shape, elemental configuration, and material selection. As shown, the tool is schematically illustrated by an elongated rack fixture 110, designated for handling a bell jar chamber (not shown) which for example has an essentially tubular shape with an open end and a close end. The elongated rack fixture 110 is shown to have a long length along x-direction which may be used to handle the bell jar chamber along its tubular length. Further, two or more support members 120 can be mounted on an upper region of the elongated rack fixture 110 with a proper spatial distance to each other. Each support member 120 has an upper edge region configured to have a spatial spread for forming an area contact with a corresponding upper inner region of the bell jar chamber when performing an extracting or lifting process. In a specific embodiment, to adapt an axial symmetry of the tubular shaped chamber, the upper edge region of the support member 120 is preferred to have the spatial spread mainly across the elongated rack fixture. In an example, the upper edge region bears the spatial spread along an arc length in a y-z plane substantially perpendicular to x-direction. One advantage of the proper spatial spread and the shape of the upper edge region is to provide much reduced stress load when the support member 120 of the elongated rack fixture 110 is used for making contact with the bell jar chamber or other target super sized process system made by a brittle material. Additionally, a softened polymeric material 130 can be installed to the upper edge and aligned along the arc length for further reducing contact stress applied to the target.

Figure 2:
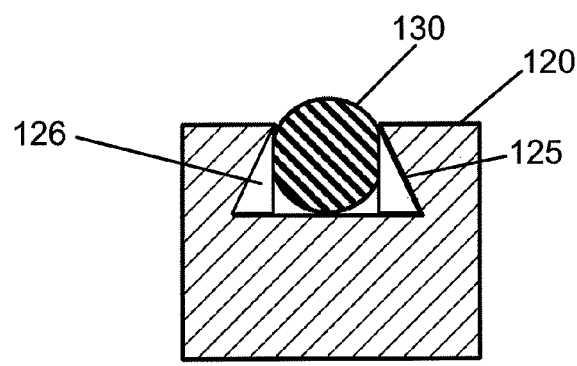
FIG. 2 is a partial cross-sectional view of a support member with an O-ring in a Dovetail groove according to one or more embodiments of the present invention.

FIG. 2 is a partial cross-sectional view of a support member with an O-ring in a Dovetail groove according to one or more embodiments of the present invention. This diagram is merely an example, which should not unduly limit the claims herein. One of ordinary skilled should recognize many variations, alternatives, and modifications. A portion of the support member 120 is shown along a cross-sectional plane in parallel to the x-direction (or perpendicular to the y-z plane) of FIG. 1. As shown, a groove region 125 is formed into the upper edge region 120. In particular, the groove is a Dovetail groove. In the example, the softened polymeric material 130 installed inside the groove region is a rubber material. In another example, a kind of partial elastic material may be used. For example, Delrin Acetal material may be used. In a specific example, an O-ring (rubber) with a proper diameter (e.g., 0.75 inches) larger than a depth of the groove region is installed so that a portion of the softened material 130 stays outside the groove region 125. The shape of Dovetail groove can keep the installed O-ring material 130 fairly firm in places. The depth of the groove and the elasticity of the O-ring material 130 can be selected to ensure it is at least partially stayed between the upper edge region 120 and any target surface region it is against. In certain example, a small triangular shaped elongated element 126 may be added to each side of the groove 125 along the arc length (perpendicular to the cross-section plane) to prevent all the O-ring material to be squeezed into the groove 125. In a specific embodiment, the groove 125 is aligned in perpendicular direction relative to the x-direction, even though the upper edge region of the support member can be an arbitrary shape depending on applications.

Figure 3:
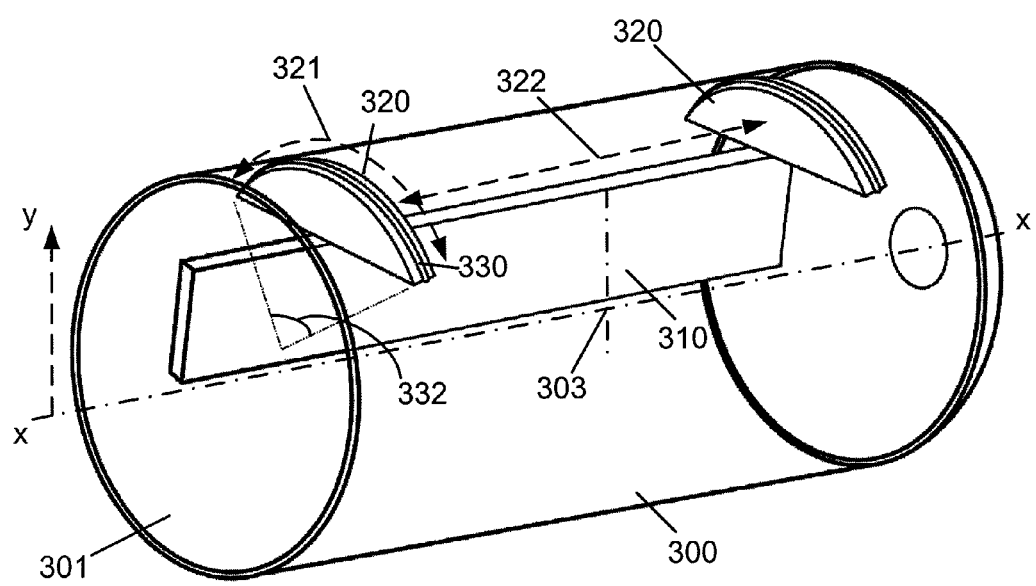
FIG. 3 is a simplified diagram illustrating a method for extracting a bell jar chamber using a tool according to an embodiment of the present invention.

Referring to FIG. 3, a simplified diagram illustrates a method for extracting a bell jar chamber using a tool according to an embodiment of the present invention. This diagram is merely an example, which should not unduly limit the claims herein. One of ordinary skilled should recognize many variations, alternatives, and modifications. As shown, the method includes using the tool described in FIGS. 1 and 2 for lifting and extracting a bell jar chamber 300 having an elongated tubular shape with an open end 301. The tool including a rack fixture 310 with at least two support members 320 is inserted through the open end 301 into an inner spatial region of the bell jar chamber 300. In particular, taking advantage of the symmetric geometric shape, the rack fixture 310 is inserted substantially in parallel to an axial direction (x) of the bell jar chamber 300. The rack fixture 310 has its length substantially within the whole inner spatial region as shown, although this is not required because it can be made much longer than the length of the bell jar chamber 300. Not shown in the FIG. 3, the rack fixture 310 is coupled to a robot loader which can be configured to move linearly along the x-direction to perform the insert operation of the rack fixture 310 including all the support members 320 mounted on an upper side of the rack fixture 310. In an embodiment the bell jar chamber 300 is disposed with its axial direction (x) aligned horizontally, although other orientations can be used.

In a specific embodiment, each of the two support members 320 spread its upper edge to an arc length 321 across the rack fixture 310. In a specific embodiment, the bell jar chamber 300 is made of quartz material to take advantage of its property as a good thermal conductor and an excellent chemical inert matter to be used as a furnace chamber in an application for conducting a reactive thermal process therein. In an implementation, the bell jar chamber 300 is removably installed within a processing station of a thin-film photovoltaic device manufacture system. For example, the tubular shaped bell jar chamber is wholly surrounded by one or more heating elements or cooling elements mounted on an outer shell body. The bell jar chamber is sealed by a cover member engaged with the open end 301. In an example, the bell jar chamber 300 is used for forming a gaseous environment for chemically treating a precursor material on large glass substrates loaded therein to form a thin-film photovoltaic absorber. In order to maintain a large scale manufacture processing within a controlled manner, the bell jar chamber 300, after certain process runs, may be extracted out of the process system for cleaning and other maintenance works while replaced with another cleaned chamber for conducting the manufacture process in the mean time. The quartz material is relatively brittle and may be breakable if the tool for extracting the bell jar chamber 300 causes an internal stress level over certain ranges defined by a minimum factor of safety. In a specific embodiment, the support members for handling the chamber are configured to provide support the bell jar chamber against all external load without causing internal stress level to be near the ranges having high failure (breaking) probability.

In the example shown in FIG. 3, each of the two support members 320 uses its full arc length 321 to engage with an upper inner region of the bell jar chamber 300. In particular, the support member 320 is substantially aligned to a (y-z) plane perpendicular to the rack fixture in x-direction (along axial direction of the bell jar chamber) so that the arc length 321 can be configured to match with the curvature of the corresponding upper inner region of the bell jar chamber. Therefore, when the support member 320 lifts the chamber (upward along y-direction), the contact area is spread to the whole arc length 321 instead of one or two isolated points, substantially reducing the stress it causes to contact area of the chamber around the upper inner region. The orientation of the spread arc length 321 takes advantage of the geometric symmetry to a target structure such as the tubular shape of the bell jar chamber. Of course, for certain variation of the target structure, the support member 320 can be aligned in one or more alternative orientation. In a specific embodiment, the arc length 321 is made to be larger than a certain range, depending on the size of the target structure, for achieving enough reduction in stress relief. As shown in FIG. 3, the arc length 321 has a corresponding included angle 332. The included angle 332 is a good indicator for a relative arc length 321 of a specific support member 320 designated for handling certain target structure. In the example, shown in FIG. 3, the included angle 332 is about 90 degrees or greater. Theoretically, the included angle 332 can be as large as 180 degrees to cover all upper half of the inner wall, but the arc length may be too long for causing inconvenience in handling of the tool itself as a whole apparatus during its application.

Additionally, the two support members 320 are disposed with a spatial gap 322 between each other. As the tool (or specifically the rack fixture 310) is inserted into the bell jar chamber 300, it should be reached to a preferred position so that when the rack fixture moves up to let the support members 320 to lift the chamber 300 the two support members 320 are respectively located substantially in a vicinity of a balanced position relative to a center of gravity 303 of the bell jar chamber 300. In an embodiment, the value of the spatial gap 322 can be relative flexible within a certain range but correspondingly the preferred position to dispose the rack fixture 310 inside the bell jar chamber must be restricted to a certain spatial range accordingly.

Referring to FIG. 3, a soften material 330 can be inserted between an upper edge of the support member 320 to cover the whole arc length 321 so that when the engagement between the support member 320 and the inner wall region occurs the soften material 330 can provide further reduction of contact stress. The soften material 330, in one or more embodiments, can be selected from one material consisting of a rubber material or other partial elastic material, for example, O-rings, or Delrin Acetal material, for lowering stress concentration in the vicinity of the contact area. As mentioned in an example shown in FIG. 2, 0.75 inches diameter O-ring cushions is used as the stress reduction soften material and installed in a Dovetail groove formed along the whole arc length of the upper edge of the support member.

Figure 4:
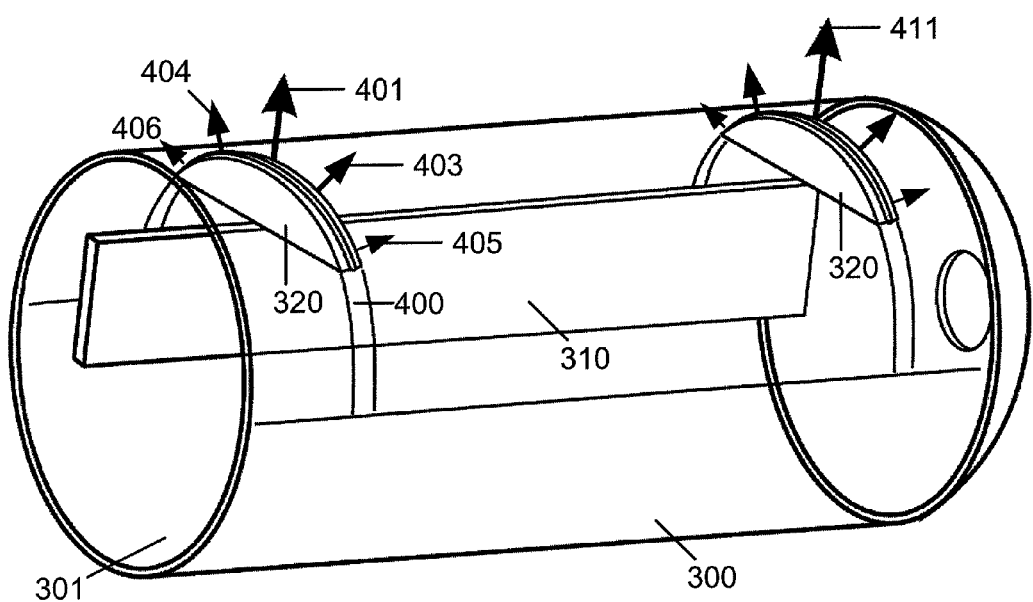
FIG. 4 is a simplified perspective view of a bell jar chamber lifted using the tool according to an embodiment of the present invention.

FIG. 4 is a simplified perspective view of a bell jar chamber lifted using the tool according to an embodiment of the present invention. This diagram is merely an example, which should not unduly limit the claims herein. One of ordinary skilled should recognize many variations, alternatives, and modifications. As shown, two support members 320 each with a lateral spread having a curved arc length are used for lifting the target tubular shaped structure 300 against its weight. One support member is located at a front tip of an elongated rack fixture 310 inserted deep into an interior space from an open end 301 and the other one is spaced away closer to the open end 301. In an embodiment, the support member 320 is the same as that described in earlier paragraphs and FIGS. 1-3. The tubular shaped structure 300 has a substantial circular inner wall. The upper edge of the support member 320 is also configured to have an arc shape with substantially the same curvature as the circular inner wall and an arc length corresponding to a 90-degree included angle. Therefore, the upper edge region of each support member 320 forms an intimate contact with a corresponding inner wall region. As shown, the only load applied to the target tubular shaped structure is its gravity. In the contact region along the upper edge with a spread arc length, tensile forces 401, 403, 404, 405, and 406, applied to the inner wall are schematically marked for several points. A belt region 400 of the inner wall extended beyond the arc length (FIG. 4) is selected to be a target region for finite element stress analysis. For example, the force 401 on the support member at the back position is primarily pointed to y-direction with a tensile stress value of about 218 lb and x- and z-element of the force 401 is substantially small, 0.00012 lb and 0.0012 lb, respectively. Because the chamber has a closed front end and an opened back end (as shown in FIG. 4), the support member at the front tip position may apply a bigger force to the corresponding region of the target structure than one applied by the back support member for a balanced lifting of the structure. For example, force 411 has a tensile stress value of about 330 lb in y-direction and two very small compressive stress values respectively in x- and z-direction.

The tool as described in above configuration for handling an exemplary bell jar chamber is modeled using a Solidworks™ Simulation software with a simplification of linear force calculation. In this model, the bell jar chamber is selected to be made by quartz material having a density of 2.05 kg/m³. The length of the bell jar chamber is set to be 80 inches and the inner diameter of the tube is set to be 40 inches with a shell thickness of about 18 mm and greater. Based on the material properties as proposed, the model yields an estimation of a tensile strength $\sigma_T$ for the specific quartz bell jar chamber to be about 4800 psi and a compressive strength $\sigma_C$ to be about 72520 psi. These estimations are comparable with values from Heraeus Brochure: tensile strength $\sigma_T$ 40 N/mm² and compressive strength $\sigma_C$ 500 N/mm², respectively. In order to determine whether the tool is able to handle the target structure without causing any stress related material or structural failure, an internal friction theory, also known as Mohr-Coulomb theory, is applied. Using Mohr-Coulomb theory, a stress-related material failure criterion is defined as:

$$\sigma_1/\sigma_T + \sigma_3/\sigma_C < 1. \tag{1}$$

Where $\sigma_1$ and $\sigma_3$ are respectively the tensile load and compressive load applied to the target structure. This criterion is used for brittle material with different tensile and compressive properties. Brittle materials do not have specific yield point and hence the yield strength is not recommended for defining limit stresses in this criterion. For designing a reliable tool for handling target structure, a design load (both tensile and compressive) for the target structure is given to provide a safe margin of stress level away from the material limit values. A factor of safety (FOS) can be defined as:

$$FOS = (\sigma_{1d}/\sigma_T + \sigma_{3d}/\sigma_C)^{-1} \qquad (2)$$

Here $\sigma_{1d}$ and $\sigma_{3d}$ are respectively the design tensile load and design compressive load applied to the target structure. For the bell jar chamber in quartz material a design load is given as 830 psi. This yields a FOS=7.0. In current model, a first principle tensile stress is estimated without considering compressive term and a finite element stress analysis is performed so that the FOS value can be mapped throughout the body of the target structure (though usually only a smaller region is selected for saving in calculation time). In a specific example, two support members 320 are respectively disposed at a position 13 inches and 73 inches from the open end 301; a soften material is also installed in a groove region of the upper edge region of each support member for providing reduction of contact force. A Delrin "O-rings" (which has a linear force deflection characteristic) is used in the model for simplifying the calculation to avoid non-linear solver. The simulation yields a minimum FOS value for this lifting configuration is 18, well above (safer) the minimum FOS 7.0 for quartz material.

Figure 5:
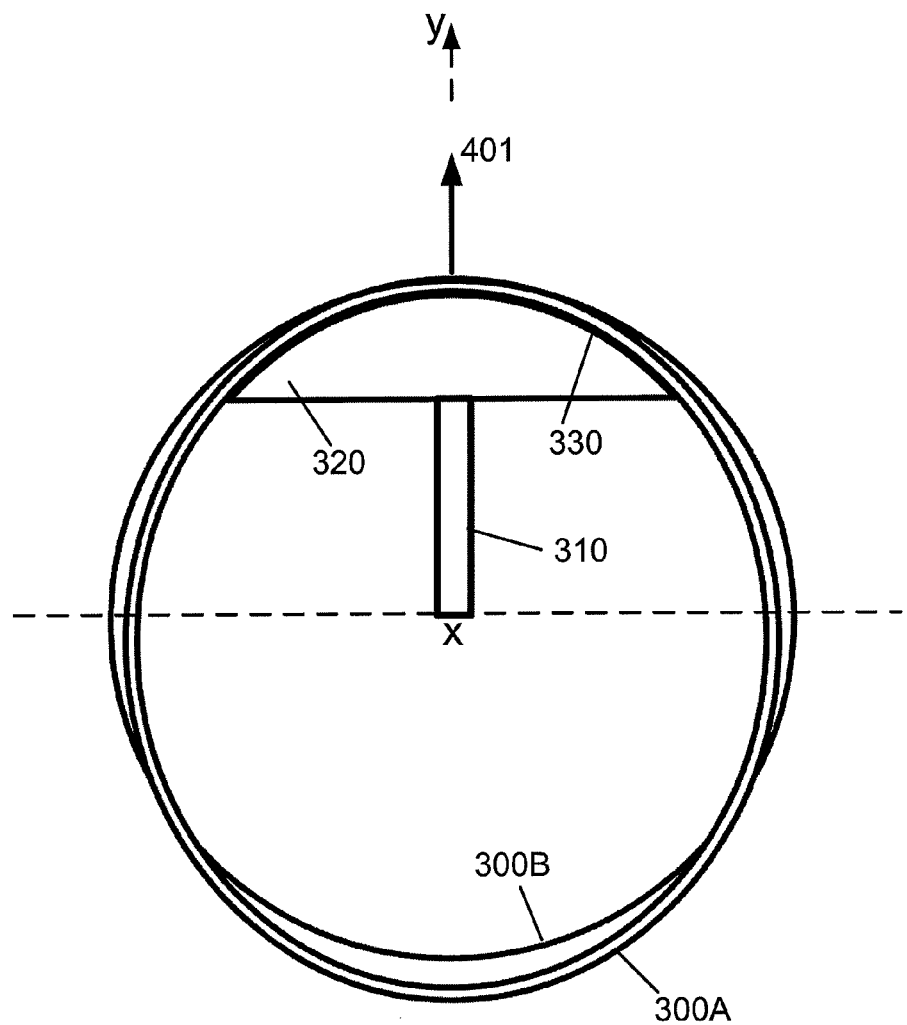
FIG. 5 is a simplified cross-sectional view of a lifted bell jar chamber under stressed deflection according to an embodiment of the present invention.

FIG. 5 is a simplified cross-sectional view of a lifted bell jar chamber under stressed deflection according to an embodiment of the present invention. This diagram is merely an example, which should not unduly limit the claims herein. One of ordinary skilled should recognize many variations, alternatives, and modifications. As shown is a view of a lifted bell jar chamber 300A from the open end direction. In a specific embodiment, the tool for lifting the bell jar chamber 300A in y-direction (up as indicated by the arrow) includes a rack fixture 310 in axial direction (into the paper plane) of the bell jar chamber and support members 320 spread laterally at least an arc length 330 in a perpendicular plane (within the paper plane). The tool is substantially the same as one used in FIG. 4 and two support members are assumed to lift at respectively 13 inches and 73 inches distances from the open end. The lifting is substantially against the gravitational force (the weight of the bell jar chamber) only. Depending on the extent of the lateral spread of the support member, the contact region only is a limited part of upper inner wall of the bell jar chamber. The weight of the bell jar chamber can cause internal stress and effectively lead to a downward chamber deflection, turning a circular shaped bell jar 300B before lifting into an oval shaped bell jar 300A after in cross sectional view. Specifically in this example, the bottom part shifted the most by about 0.01 inches. The deflection of the bell jar 300A also causes a higher contact force near two end points of the support member against the inner wall. For example, the contact force is about 137 lb at the end point associated with the front support member and about 319 lb at the end point associated with the back support member near the open end. The estimation of these contact forces is based on a tool configuration mentioned above (FIGS. 4 and 5) and has Delrin O-rings installed in the contact region 330. In an implementation, the Delrin O-rings can be replaced by rubber O-rings, the gravitational force induced contact force at the end point is expected to be lower.

Figure 6:
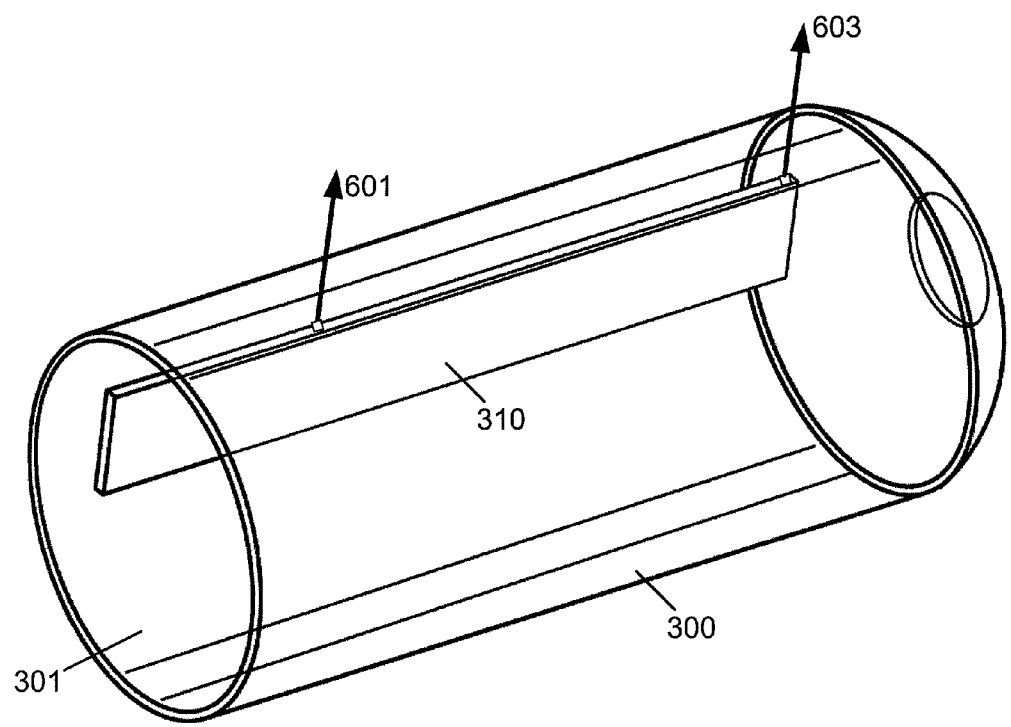
FIG. 6 is a perspective view of a worst case example of lifting the bell jar chamber by contact at concentrated points according to an embodiment of the present invention.

FIG. 6 is a perspective view of a worst case example of lifting the bell jar chamber by two contact points according to an embodiment of the present invention. This diagram shows an extreme case using concentrated points of contact. As shown, the support member with lateral spread is simply removed and the rack fixture 310 is inserted along an axial direction of a bell jar chamber 300 from an open end 301 to use two protruded points on its upper edge directly for lifting the bell jar chamber. In this configuration, the same simulation model based on a Solidworks™ software is applied to calculate the stress distribution throughout the body of the chamber 300. Regional finite element analysis yields an estimated minimum FOS value of 3.9 by Mohr-Coulomb theory. Certainly this value is smaller than FOS value 7.0 for quartz. In other words, this indicates that the simplified tool as shown in FIG. 6 may not be a safe tool for lifting the target bell jar chamber. The bell jar chamber 300 can be broken by lifting from an upper inner region with such two concentrated contact points along a narrowed bar along axial direction of the rack fixture 310. Specifically, a maximum tensile stress 603 is obtained at the inner contact point with an estimated value to be 2903 psi. It is well above the design load for this target structure and a half of the tensile strength for quartz material.

Also note that, in an alternative example, the open end 301 of the bell jar chamber 300 has a geometric asymmetric stress effect induced by gravity. The two support members not only should be disposed separately with a proper distance from the center of gravity of the bell jar chamber, but also should be disposed at least a certain preferred distance away from the open end 301 so that the stress level for any local contact region would not surpass the intrinsic tensile/compressive strength of the material. An exemplary analysis shows that with a contact point associated with the back support member at 12 inches closer to the open end 301, the stress at the contact point can be as large as 10000 psi due to the change of the load distribution. This is well above the tensile strength of 5800 psi and most likely will result in tube breaking.

Figure 7:
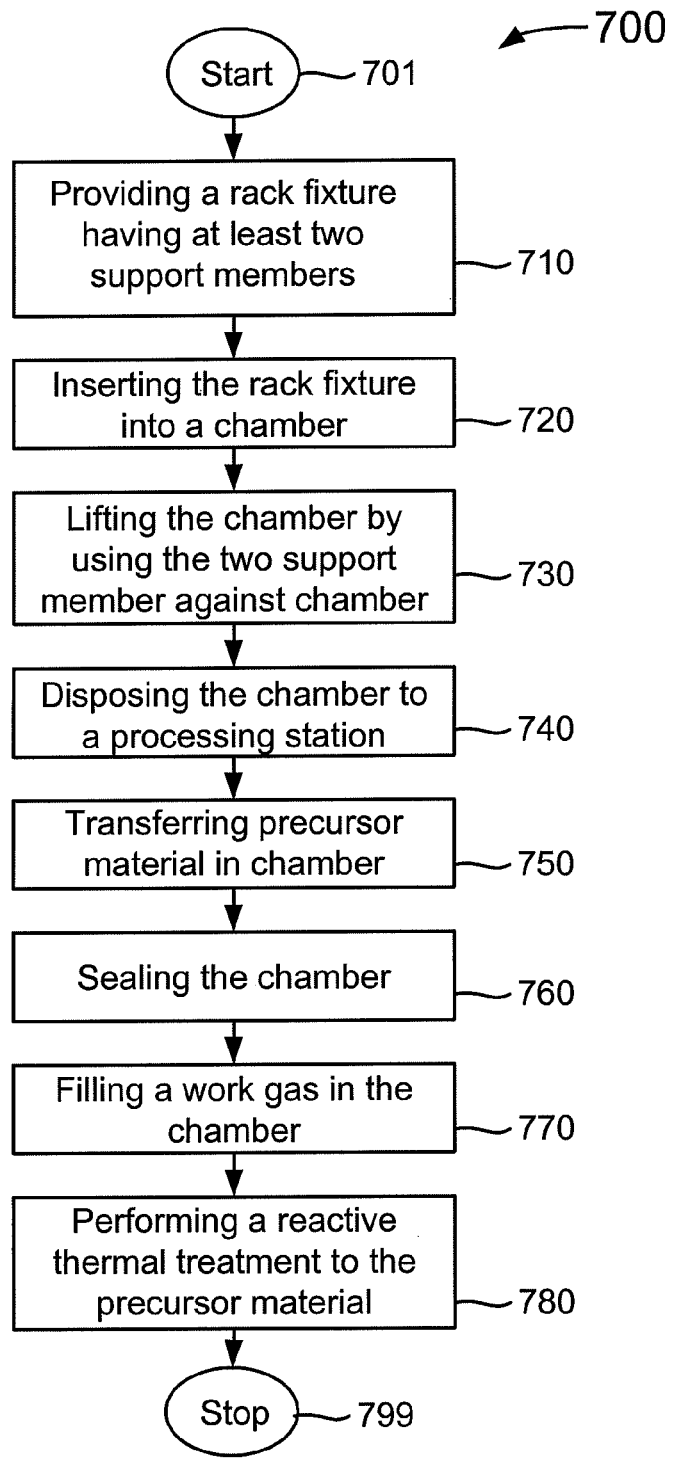
FIG. 7 is a simplified flow diagram of a method for handling a chamber for manufacturing a photovoltaic device according to an embodiment of the present invention.

FIG. 7 is a simplified flow diagram of a method for handling a chamber for manufacturing a photovoltaic device according to an embodiment of the present invention. As shown in FIG. 7, the present method is described below.

1. Start;
2. Provide a rack fixture having at least two support members;
3. Insert the rack fixture from an open end into the chamber along an axial direction;
4. Lift the chamber by using the two support members against respective upper inner regions of the chamber;
5. Dispose the chamber to a processing station;
6. Transfer a precursor material into the chamber;
7. Seal the open end of the chamber;
8. Filling a work gas in chamber;
9. Perform a reactive thermal treatment to the precursor material to form a photovoltaic absorber; and
10. Stop.

As shown, the above method provides a way of handling a chamber for the manufacture of a photovoltaic device according to an embodiment of the present invention. In a preferred embodiment, the method uses a chamber made by quartz material that is inert to the reactive chemical and good in thermal conduction for conducting the desired thermal reactive process therein for forming a photovoltaic absorber material. The chamber can be a tubular bell jar shape and can be also a rectangular cubic shape or other geometries. The chamber can have large size of about 2 meters or greater in length and 1 meter or greater in diameter with about 18 mm or greater in shell thickness.

As shown in FIG. 7, the method 700 starts with a start step 701. The present method provides a method for safely handling a chamber (having a particularly large size) made by brittle material and disposing in a processing station of a thin-film photovoltaic device manufacture system. The chamber and its disposition are designed specifically for large scale reactive thermal processing of thin-film photovoltaic materials. According to an embodiment, the chamber is a removable module of a furnace system so that the chamber can be extracted out for maintenance and disposed with a ready-to-use replacement chamber, all handled by a tool designed according to embodiments of the present invention. In regards to the chamber extraction and re-disposition using the tool, factor of safety of the design of the tool itself and associated configuration can play a role within overall manufacture processes. Here, the method begins with an implementation of a tool at a target structure, such as the one noted above, as well as others.

The tool includes a rack fixture having at least two support members provided in step 710. The rack fixture can be associated with a robot loader that is capable of moving linearly, for example, along x-direction horizontally in parallel to an axial direction associated with a tubular shaped target structure. In an embodiment, the rack fixture is an elongated bar structure with a first support member being spaced from a second support member.

The tool further includes the at least two support members on an upper region of the rack fixture. In an embodiment, the rack fixture has a length selected based on the target structure, for example, a tubular shaped bell jar chamber. The length of the rack fixture is at least no shorter than 75% of the length of the bell jar chamber. In another embodiment, one of support members is mounted on a front end of the rack fixture and at least another one is mounted at a position with a predetermined distance from the front end. Depending on target structure geometric shape and material property, the mounting position of the support members can be within a range of distances relative to the target structure. The support member can be in different orientations relative to the elongated rack fixture. In a specific embodiment, the support member is aligned substantially in a plane perpendicular to the length direction of the rack fixture.

Through an open end of the target bell jar chamber, the rack fixture including the at least two support members can be inserted within an inner diameter along an axial direction, as shown in step 720. In an embodiment, the tool is coupled to a robot loader. The robot loader is configured to move horizontally to insert the whole rack fixture into the bell jar chamber which is set on a base support with the bell jar axial direction (e.g, x-direction) in a horizontal direction.

Further, the method 700 includes a step 730 to lift the chamber by using the two support members against respective upper inner regions of the chamber. In a specific embodiment, the same robot loader is used to raise the whole rack fixture upward (e.g., in a y-direction which is normal to the x-direction) such that each support member forms a contact region with the bell jar chamber. In another specific embodiment, the support member is configured to have its upper region being spread laterally with a curved length that is configured to be substantially matched in curvature with the upper inner region of the chamber. Additionally, the upper region of the support member can include a soften material so that the contact region becomes cushioned for reducing stress or at least unidirectional contact forces. For example, a rubber material such as that for O-rings can be installed in a groove region formed in the upper region. This feature may be critical in stress reduction especially between a hard material (the tool) and a brittle material (the chamber). In yet another specific embodiment, the contact region for each support member is within a preferred location range so that lifting the target structure (the chamber) by the two support members would be balanced against the whole external load, which is only a gravitational force for the present implementation. Overall, the lifting of the chamber by the configured tool can be monitored through a stress indicator so that the handling of the chamber by the tool in a specific configuration has a factor of safety substantially higher than a minimum factor of safety associated with intrinsic material property. Therefore, once the lifting step is completed, the chamber is under a stress level that is safe and substantially small in risk of breakage or stress-related failure.

Once the chamber is lifted, the method performs a next step 740 to dispose the lifted chamber into a processing station of a manufacture system for treating thin-film photovoltaic materials. In particular, the processing station is an apparatus for holding the chamber and providing controlled thermal energy to the chamber so that a reactive thermal treatment can be performed to one or more thin-film materials on substrates loaded inside the chamber. This step can be further carried out by using the robot loader to move the bell jar chamber lifted by the two support members of the rack fixture. The bell jar chamber is moved into the processing station which is configured to be surrounded by one or more heaters mounted in a shell structure. The process station also can be equipped with one or more cooling devices for maintaining a balanced thermal energy control. The combined heaters and cooling devices are designed to supply thermal energy to the bell jar chamber and additionally to control chamber temperature following a predetermined temperature profile designated for treating thin-film photovoltaic materials on a plurality of substrates. After disposing the bell jar chamber in the processing station, the tool can be retracted out of the chamber, again controlled by the robot loader in both vertical and horizontal directions.

The method 700 additionally includes step 750 to transfer one or more substrates bearing one or more thin-film precursor materials into the bell jar chamber through the open end. In a specific embodiment, the one or more thin-film precursor materials include copper indium (or gallium) mixture (or alloy) materials pre-deposited on glass substrates. These precursor materials are examples of many material elements used for forming thin-film photovoltaic solar cells.

Referring to FIG. 7, the method 700 further applies step 760 to seal the chamber by using a cover member engaged with the open end of the bell jar chamber. The step 760 further includes pumping down the chamber to achieve a desired vacuum condition. The cover member includes a vacuumed edge ring to ensure tightly close of the open end. In an embodiment, the pump outlet is built on the cover member and the vacuum is monitored by one or more pressure sensors.

The method 700 further includes filling the chamber with a work gas up to a desired pressure level in step 770. The work gas is designed for react with the precursor material for forming a desired end material product. For example, the work gas includes hydrogen selenide gas mixed with pure nitrogen gas for treating a copper-indium-gallium based precursor thin-film material. The gas filling inlet can be built in the cover member mentioned before.

Furthermore, the method 700 can start step 780 to perform a reactive thermal treatment of the precursor material loaded in the chamber using thermal energy supplied by the one or more heaters following a predetermined temperature profile. The process includes temperature ramping stages and temperature dwelling stages so that the precursor material on the substrates can react with the work gas in the gaseous environment formed inside the heated bell jar chamber. For example, a dwelling stage is set to be at 425° C. for 10-80 minutes. The method 700 may end with step 799 after the precursor material is transformed into a photovoltaic absorber material by the reactive thermal treatment inside the bell jar chamber.

The above sequence of processes or steps provides a handling method for a chamber used for processing a thin-film photovoltaic material according to an embodiment of the present invention. As shown, the method uses a combination of steps including providing a specific tool for safely handling a target structure which is a shaped chamber made by a relative brittle material, disposing the shaped chamber in process system, transferring precursor materials in the shaped chamber, and performing reactive thermal treatment of the precursor materials for the manufacture of the thin-film solar cells.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. An apparatus for extracting a bell jar chamber from a processing station of a thin film photovoltaic material, the apparatus comprising:
    a rack fixture coupled to a robot loader, the rack fixture being configured to support the bell jar chamber to be moved using the robot loader in a horizontal direction and in a vertical direction, the horizontal direction being normal to the vertical direction; and
    at least two support members configured within a vicinity of an upper region of the rack fixture, the two support members having respective arc length regions, the respective arc length regions supporting at least respective upper inner regions of the bell jar chamber.

2. The apparatus of claim 1 further comprising polymeric material overlying each of the two support members, the polymeric material being configured to cushion the arc length regions of the support members; wherein the bell jar chamber comprises a quartz material, the bell jar chamber having an axial length of about 200 cm and greater from an open end to a closed end, a diameter of 100 cm and greater, and a shell thickness of about 1.8 cm and greater, the bell jar chamber being characterized by an intrinsic factor of safety of about 7.0 based on Mohr-Coulomb failure theory applied for the quartz material.

3. The apparatus of claim 2 wherein the polymeric material is selected from one material consisting of a rubber material, an O-ring, or a Delrin Acetal material.

4. The apparatus of claim 2 wherein each of the at least two support members is no closer to the open end of the bell jar chamber than a distance of 15% of an axial length of the bell jar chamber.

5. The apparatus of claim 1 wherein each support member comprises a groove region formed from a first end to a second end along the arc length region, the arc length region being configured with a curvature substantially fitted with the upper inner region of the bell jar chamber; wherein each of the support members comprising an annular rubber member coupled within the groove region to cushion the support member from the upper inner region of the bell jar chamber.

6. The apparatus of claim 5 wherein the groove region comprises a dovetail structure.

7. The apparatus of claim 5 wherein the first end and the second end of the arc length region comprises an corresponding included angle of about 90 degrees and greater.

8. The apparatus of claim 1 wherein the two support members comprising a first support member spaced from a second support member to balance the bell jar chamber around a center of gravity of the bell jar chamber.

9. The apparatus of claim 1 wherein the processing station comprises an apparatus configured for holding the bell jar chamber and providing thermal energy to the bell jar chamber for thermally treating photovoltaic materials on a plurality of substrates loaded inside the bell jar chamber.

10. The apparatus of claim 1 wherein the rack fixture is configured to support the bell jar chamber to maintain a stress level of the bell jar chamber to below a breakage stress of the bell jar chamber by a factor of safety, the factor of safety being defined as an inverse sum of a first ratio of an applied tensile stress over a tensile strength of chamber material and a second ratio of an applied compressive stress over a compressive strength of chamber material.

11. The apparatus of claim 1 wherein the bell jar chamber is subjected to only a stress associated with a gravitational force.

12. A method for extracting a bell jar chamber with a brittle mechanical characteristic, the method comprising:
    providing a rack fixture having at least two support members, each support member comprising an upper edge region;
    inserting the rack fixture including the at least two support members from an open end horizontally into a bell jar chamber along an axial direction of the bell jar chamber; and
    moving the rack fixture to use the at least two support members to lift the bell jar chamber against a gravitational force for extracting the bell jar chamber from a processing station.

13. The method of claim 12 wherein the providing the rack fixture comprises coupling the rack fixture to a robot loader configured to move horizontally and vertically.

14. The method of claim 12 wherein the providing the rack fixture having at least two support members comprises disposing a first two support member spaced from a second support member by a predetermined distance related at least to a center of gravity of the bell jar chamber.

15. The method of claim 12 wherein each of the at least two support members comprises a groove region formed from a first end to a second end along the upper edge region, the groove region being configured to hold a soften material for reducing stress level of the bell jar chamber around a contact region between the upper edge region of the two support members and an upper inner region of the bell jar chamber.

16. The method of claim 12 wherein the moving the rack fixture comprises positioning the two support members to respective positions that are substantially balanced relative to a center of gravity of the bell jar chamber and at least a predetermined distance away from the open end of the bell jar chamber.

17. The method of claim 16 wherein the predetermined distance comprises about 15% of an axial length of the bell jar chamber.

18. The method of claim 12 wherein the using the two support members to lift the bell jar chamber comprises raising and moving the bell jar chamber without causing a stress level of the bell jar chamber to surpass a factor of safety defined by Mohr-Coulomb failure theory for a brittle material.

19. A method for handling a chamber for manufacturing a photovoltaic device, the method comprising:
    providing a rack fixture having at least two support members;
    inserting the rack fixture including the at least two support members from an open end into the chamber along an axial direction;

raising the rack fixture to form a contact region between each of the two support members and an upper inner region of the chamber;
lifting the chamber against a gravitational force;
disposing the chamber to a processing station including at least one or more heaters;
transferring a substrate bearing a thin-film precursor material into the chamber;
sealing the open end of the chamber to create an vacuum condition;
filling a work gas in the chamber to maintain a predetermined gaseous environment; and
performing a reactive thermal treatment to the thin-film precursor material in the gaseous environment by supplying thermal energy from the one or more heaters based on a predetermined temperature profile, the thin-film precursor material being transformed to a photovoltaic absorber.

20. The method of claim 19 wherein the chamber comprises a quartz bell jar having a tubular shape with an open end and a closed end.

21. The method of claim 20 wherein each of the two support members is configured to have the contact region spread laterally with an arc length following the tubular shape of an inner region of the bell jar, the arc length corresponding to an included angle of 90 degrees and greater.

22. The method of claim 21 wherein the inner region of the bell jar is subjected to a contact force substantially smaller than an intrinsic stress strength of the quartz bell jar.

\* \* \* \* \*